United States Patent [19]

Tanizawa et al.

[11] Patent Number: 4,716,310
[45] Date of Patent: Dec. 29, 1987

[54] LOGICAL BIMOS GATE CIRCUIT HAVING LOW POWER DISSIPATION

[75] Inventors: Tetsu Tanizawa, Kawasaki; Osam Ohba, Tokyo, both of Japan

[73] Assignee: Fujitsu Limited, Kawasaki, Japan

[21] Appl. No.: 781,742

[22] Filed: Sep. 30, 1985

[30] Foreign Application Priority Data

Oct. 2, 1984 [JP] Japan ................... 59-205511

[51] Int. Cl.[4] ............ H03K 17/16; H03K 19/02; H03K 5/08; H03K 17/60
[52] U.S. Cl. .................... 307/446; 307/443; 307/554; 307/570
[58] Field of Search .......... 307/446, 570, 270, 443, 307/554, 296 R, 273

[56] References Cited

U.S. PATENT DOCUMENTS 4,425,516 1/1984 Wanlass ..................... 307/446

FOREIGN PATENT DOCUMENTS 0145004 12/1983 European Pat. Off. ......... 307/446

Primary Examiner—John S. Heyman
Assistant Examiner—M. R. Wambach
Attorney, Agent, or Firm—Staas & Halsey

[57] ABSTRACT

A logical gate circuit includes an emitter-grounded switching transistor and a pull-up circuit connected to a collector of the switching transistor. The switching transistor is cut OFF when an input signal has a high level and is turned ON when the input signal has a low level. A control MIS transistor is connected to a base of the switching transistor and is turned ON and OFF in response to respective low and high levels, of the output terminal of the switching transistor. An input transistor is connected in series with the control MIS transistor and is turned ON and OFF when the input signal is high and low, respectively. Thus, the logical gate circuit allows current to flow only during a transient signal period.

10 Claims, 10 Drawing Figures

LOGICAL BIMOS GATE CIRCUIT HAVING LOW POWER DISSIPATION

BACKGROUND OF THE INVENTION

1. Field of the Invention

The present invention relates to a logical gate circuit. More particularly, it relates to a logical gate circuit which provides a bipolar transistor at the output stage, such as a TTL gate circuit.

2. Description of the Related Art

In a conventional logical gate circuit using a bipolar transistor, for example a TTL gate circuit, a bipolar transistor having a high drive capacity, and in particular, a bipolar transistor having a vertical construction, is suitable for rapidly switching a large current. As the TTL circuit provides an emitter grounded type inverter using such a bipolar transistor at the output stage, high speed and large current switching capacity are possible and a capacitive load can be used.

However, such a conventional logical gate circuit has some drawbacks, for example, when the inverter transistor at the output stage is ON, the base current and the collector current continuously flow, resulting in high power dissipation.

SUMMARY OF THE INVENTION

An object of the present invention is to provide a logical gate circuit having a low power dissipation and a high driving capacity.

Another object of the present invention is to provide a logical gate circuit in which the current flows only when the logical gate circuit is in a transient state.

According to the present invention, to solve the above problems, a logical gate circuit is provided comprising an emitter grounded type switching transistor, an active load circuit connected to a collector of the switching transistor, which is cut off when an input signal is at a first level and is made on when that input signal is at a second level and control MIS transistor means connected in series with input MIS transistor means in a base circuit of the switching transistor. The control MIS transistor is made ON or OFF in response to the ON and OFF of the switching transistor. The input MIS transistor means is made ON when the input signal is at the first level.

Preferably, the logical gate circuit comprises an NPN transistor and a PNP transistor, each having a collector connected to a common output terminal and each having an emitter connected to a first and a second power source, respectively, first and second N channel MIS transistor means connected in series between the base of the NPN transistor and the second power source, and first and second PNP transistor means connected in series between the base of the PNP transistor and the first power source. The first N channel MIS transistor means and the first P channel MIS transistor means are made ON and OFF in response to an output signal and the second N channel MIS transistor means and the second P channel MIS transistor means are made ON and OFF in response to the input signal.

According to the present invention, by using the above-mentioned means, after the emitter grounded type switching transistor at the output stage is placed in an OFF state, the base current of the switching transistor is cut off. Therefore, after the transient operation, the switching transistor again enters a cut off state, so that the power dissipation in the steady state can be reduced to almost zero.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
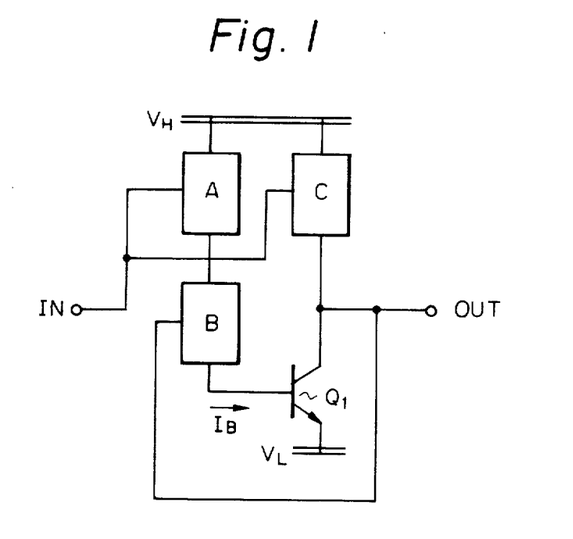
FIG. 1 is a block diagram showing the principle of the logical gate circuit of one embodiment of the present invention.

Hereinafter, the embodiment of the present invention will be explained with reference to the drawings. FIG. 1 shows the principle of the logical gate circuit of one embodiment of the present invention. The circuit shown in FIG. 1 provides a bipolar transistor, namely, an inverter transistor $Q_1$ having an emitter connected to a low voltage terminal $V_L$ of the power source, that is, an emitter grounded transistor, a pull up circuit C connected between the collector of the inverter transistor $Q_1$ and a high voltage terminal $V_H$ of the power source, and switching circuits A and B connected between the base of the transistor $Q_1$ and the high voltage terminal $V_H$. The pull up circuit C is controlled by an input signal I and enters an ON state when the input signal IN becomes low level. The switching circuit A is also controlled by the input signal IN, but enters an ON state when the input signal IN becomes high level. The switching circuit B is controlled by the collector voltage of the transistor $Q_1$, that is, the output signal OUT, and the switching circuit B enters in an ON state when the collector voltage becomes high level. The pull up circuit C and switching circuits A and B are formed by a switching elements having a high input impedance, for example, MIS type transistors. Further, the switching circuits A and B are connected in series, and thus it is possible to change the order thereof.

Figure 2:
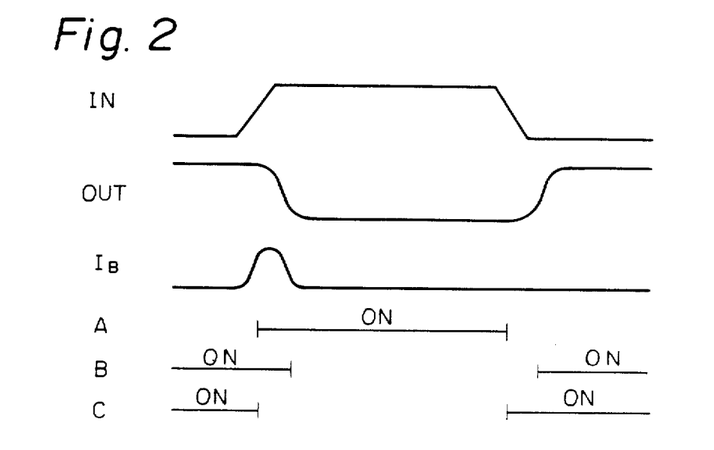
FIG. 2 is a timing diagram for explaining the operation of the circuit shown in FIG. 3.

The operation of the circuit shown in FIG. 1 will be explained with reference to FIG. 2. When the input signal IN is at a low level, the pull up circuit C is in an ON state, and the output signal OUT is at a high level. Therefore, the switching circuit B is in an ON state. However, when the switching circuit A is in the cut off state, then the base current of the transistor $Q_1$ is not supplied, so that the transistor $Q_1$ is in an OFF state. When the input signal IN is changed from low level to high level, the switching element A enters an ON state. Then, the base current is supplied via the switching elements A and B from the high voltage terminal $V_H$ to the transistor $Q_1$, so that the transistor $Q_1$ enters an ON state. At this time, the pull up circuit C is in a cut off state, so that the output signal OUT is changed from high level to low level. When the output signal OUT is changed to low level, the switching circuit B enters a cut off state and the base current of the transistor $Q_1$ is cut off, then the transistor $Q_1$ enters an OFF state. At this time, the pull up circuit C is in the cut off state, therefore, if the transistor $Q_1$ enters an OFF state, the output OUT is held at a low level. As shown in FIG. 2, the base current $I_B$ of the transistor $Q_1$ flows transistently when the transistor $Q_1$ is changed to the ON state, and does not flow after the output signal OUT becomes low level at a steady state. Further, during the time that the output signal OUT is at the low level, the pull up circuit C is also in a cut off state, and the current does not flow in the output stage including the pull up circuit C and the transistor $Q_1$.

Next, when the input signal IN changes from high level to low level, the pull up circuit C becomes ON and the output signal OUT is raised to a high level. At this time, as mentioned above, the transistor $Q_1$ is in a cut off state immediately after the output signal OUT is changed from high level to low level, then, even when the input signal IN is then inverted and the output signal OUT changed from low level to high level, a rush current does not occur and a high speed switching is carried out. Further, even when the output signal OUT is in a high level at a steady state, the switching element A is placed in a cut off state by the input signal IN, and the transistor $Q_1$ is in a completely cut off state, therefore, no current flows in the output stage.

Figure 3:
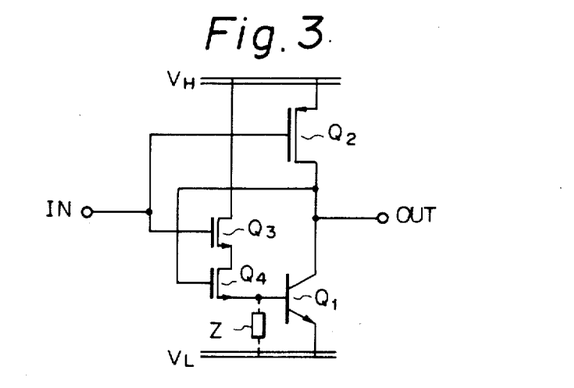
FIG. 3 is a circuit diagram of an embodiment of the present invention.

FIG. 3 shows a logical gate circuit according to another embodiment, which utilizes the circuit shown in FIG. 1. The circuit shown in FIG. 3 provides an emitter grounded NPN switching transistor $Q_1$. In FIG. 3, a P-channel MOS transistor $Q_2$, used as the pull up circuit C, is an enhancement type transistor, an N-channel MOS transistor $O_3$, used as the switching circuit A, is also an enhancement type transistor, and an N-channel MOS transistor $Q_4$, used as the switching circuit A, may be a depletion or enhancement type transistor. When a depletion type transistor is used, a sufficient low level can be obtained at the output OUT, but when an enhancement type transistor is used, the low level obtained at the output OUT is somewhat high. As only the base current of the transistor $Q_1$ flows in the transistors $Q_3$ and $Q_4$, the current capacity of the transistors $Q_3$ and $Q_4$ may be small.

In the circuit shown in FIG. 3, when the input IN is in a high level state, the transistor $Q_1$ is OFF, the transistor $Q_3$ is ON, and the transistor $Q_4$ is OFF, because the output OUT is at a low level as mentioned above. Therefore, the base current and the collector current of the transistor $Q_1$ are both cut off. Further, when the input signal IN is in a low level state, the transistor $Q_3$ is in an OFF state, and the transistor $Q_1$ is also in an OFF state. The transistor $Q_2$ is in an ON state and the output signal OUT is held at a high level. Therefore, in this case also, both the base and collector of the transistor $Q_1$ are cut off. Further, the impedance element Z is provided to sufficiently discharge the charges in the base of the transistor Q and completely cut off the transistor $Q_1$ when the input signal IN becomes low level, or when the output signal OUT becomes low level and the transistor $Q_3$ or $Q_4$ is cut off.

In the circuit shown in FIG. 3, the transistors $Q_2$ and $Q_3$ are preferably enhancement type, because these transistors are made ON and OFF in accordance with the input signal IN. The low level $V_{OL}$ in the output is as follows:

$$V_{OL} = V_{BE}(Q_1) + V_{th}(Q_4)$$

Then, to obtain a sufficiently low $V_{OL}$, it is preferable that the $Q_4$ transistor be the depletion type. This is because the value of $V_{th}(Q_4)$ will be negative. Thus, this circuit is suitable to lower the value of $V_{OL}$. Further, the input of the next stage gate to be connected to the output OUT, preferably has a high impedance, such as an MIS transistor gate terminal, because, the transistors $Q_1$ and $Q_2$ are both in a cut off state when in the steady state. Furthermore, the size of the MOS transistors $Q_3$ and $Q_4$ may be small, because these transistors have only to supply a small base current to the transistor $Q_1$.

Figure 4:
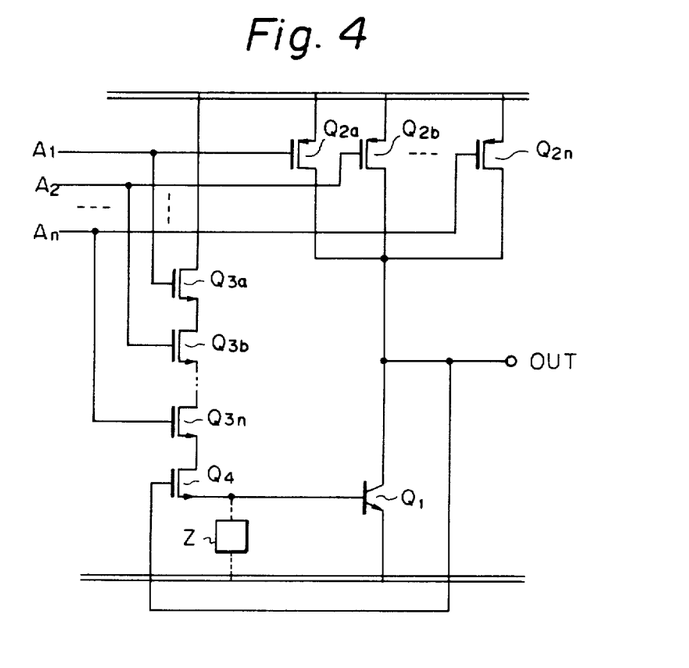
FIGS. 4 and 5 are circuit diagrams of a modified embodiment of the circuit shown in FIG. 3.

FIG. 4 shows a modified embodiment of the circuit shown in FIG. 3. In FIG. 4, n transistors $Q_{2a}$, $Q_{2b}$..., $Q_{2n}$ are connected in parallel as the pull up circuit, and n transistors $Q_{3a}$, $Q_{3b}$..., $Q_{3n}$ are connected in series as the switching circuit A. Inputs $A_1$, $A_2$, ..., $A_n$ are connected to the gates of the transistor $Q_{2a}$, ..., $Q_{2n}$ and the transistor $Q_{3a}$, ..., $Q_{3n}$ as shown in FIG. 4. The circuit shown in FIG. 4 functions as a NAND circuit, that is, the output OUT is expressed as:

$$OUT = \bar{A}HD\ 1\ \bar{A}_2 \ldots \bar{A}n$$

Figure 5:
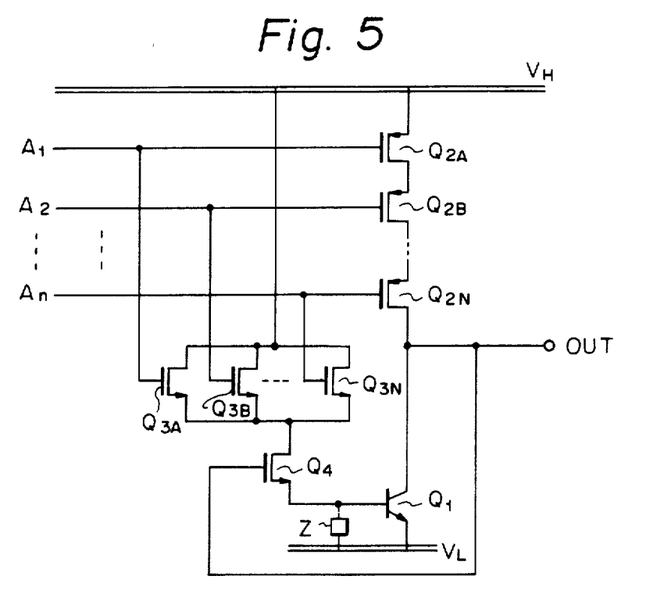

FIG. 5 shows another modified embodiment of the circuit shown in FIG. 3. In FIG. 5, n transistors $Q_{2A}$, $Q_{2B}$, ..., $Q_{2N}$ are connected in series as the pull up circuit, and n transistors $Q_{3A}$, $Q_{3B}$, ..., $Q_{3N}$ are connected in parallel as the switching circuit A. Inputs $A_1$, $A_2$, ..., $A_n$ are connected to the gates of the transistors $Q_{2A}$, ..., $Q_{2N}$ and the transistors $Q_{3A}$, ..., $Q_{3N}$ as shown in FIG. 5. The circuit shown in FIG. 5 functions as a NOR circuit, that is, the output OUT is expressed as:

$$OUT = \bar{A}_1 + \bar{A}_2 + \ldots + \bar{A}N$$

Figure 6:
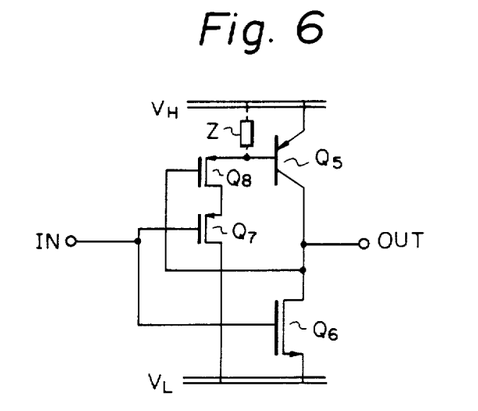
FIG. 6 is a circuit diagram of another embodiment of the present invention.

FIG. 6 shows a logical gate circuit according to a further embodiment of the present invention which utilizes the circuit shown in FIG. 1. In the circuit shown in FIG. 6, the inverter transistor $Q_1$ in FIG. 1 is replaced by a PNP type switching transistor $Q_5$, the pull up circuit C is replaced by an N channel MOS transistor $Q_6$, and the switching transistor A and B are replaced by P channel MOS transistors, $Q_7$ and $Q_8$, respectively.

Figure 7:
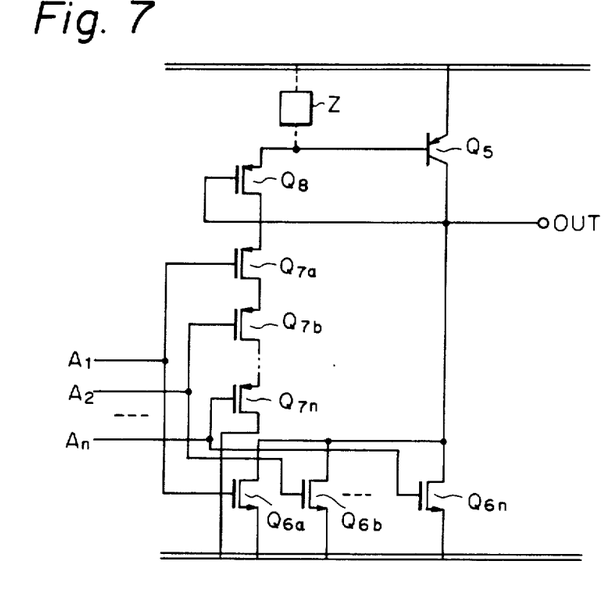
FIG. 7 is circuit diagram of a modified embodiment of the circuit shown in FIG. 6.

FIG. 7 shows a modified embodiment of the circuit shown in FIG. 3. In FIG. 7, n transistors $Q_{6a}$, $Q_{6b}$, ..., $Q_{6n}$ are connected in parallel as the pull down circuit, and n transistors $Q_{7a}$, $Q_{7b}$, ..., $Q_{7n}$ are connected in series as the switching transistor circuit A. Inputs $A_1$, $A_2$, ... $A_n$ are connected to the gates of the transistors $Q_{6a}$, ... $Q_{6n}$ and the transistors $Q_{7a}$, ..., $Q_{7n}$, as shown in FIG. 7. The circuit shown in FIG. 7 functions as a NOR circuit, that is, the output OUT is expressed as:

$$OUT = \bar{A}_1 + \bar{A}_2 + \ldots + \bar{A}N$$

Figure 8:
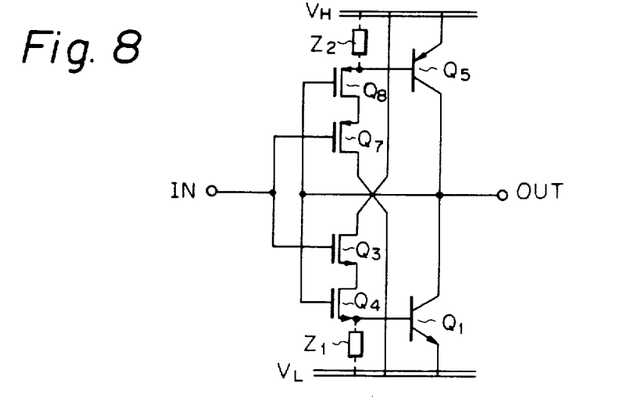
FIGS. 8 to 10 are circuit diagrams of further embodiments of the present invention.

FIG. 8 shows a complemental type logical gate circuit according to a still further embodiment of the present invention. This circuit is formed by combining the circuits of FIG. 3 and 6. The circuit shown in FIG. 8 includes NPN transistor $Q_1$ and PNP transistor $Q_5$, the collectors of which are connected to each other and the emitters of which are connected to the low voltage terminal $V_L$ or the high voltage terminal $V_H$, respectively; N channel MOS transistors $Q_3$ and $Q_4$ connected in series between the base of the transistor $Q_1$ and the high voltage terminal $V_H$; P channel MOS transistor $Q_7$ and $Q_8$ connected in series between the base of the transistor $Q_5$ and the low voltage terminal $V_L$; and impedance elements $Z_1$ and $Z_2$ respectively connected between the base of the transistors $Q_1$ or $Q_5$ and the low voltage terminal $V_L$ or the high voltage terminal $V_H$. The gates of the transistors $Q_3$ and $Q_7$ are connected to the input terminal and the gates of the transistors $Q_4$ and $Q_8$ are connected to the output terminal.

In the circuit shown in FIG. 8, when the input signal IN changes from high level to low level at the time when the output signal OUT is low level, the transistor $Q_7$ enters the ON state. The transistor $Q_8$ is in an ON state and when the output signal OUT is low level. Thus, the base potential of the transistor $Q_5$ is lowered so that the transistor $Q_5$ is placed in an ON state. Then the output signal OUT is raised to a high level and the transistor $Q_8$ is cut off, which cut, off the base current of the transistor $Q_5$. Therefore, after the output signal OUT is placed in a high level steady state, the transistor $Q_5$ is cut off, and thus a steady current does not flow in the output stage. Further, in this case, when the input signal IN is at a low level, then the transistor $Q_3$ is cut off and the transistor $Q_1$ is also cut off. When the input signal IN changes from low level to high level, a similar operation is carried out. In each case, it is clear that the current flows in the transient state but does not flow in the steady state. Further, in the circuit shown in FIG. 8, as the output stage is formed by the complementary bipolar transistors, the driveability is increased by a signal of either polarity, and thus the operation speed can be increased. Further, by using a complementary type circuit, the noise margin can be improved.

Figure 9:
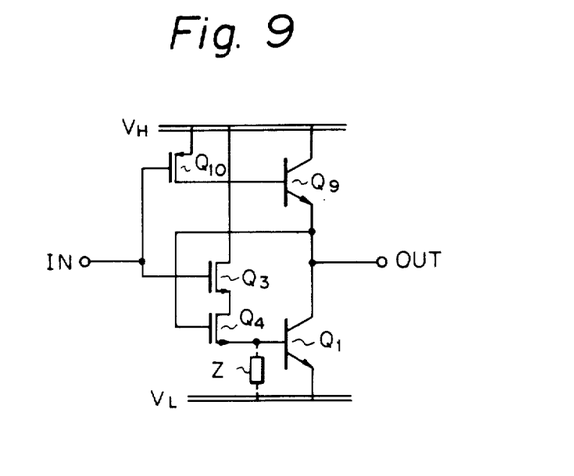

FIG. 9 shows a logical gate circuit as a further embodiment of the present invention. In the circuit shown in FIG. 9, a combination of P channel MOS transistor $Q_{10}$ and NPN type transistor $Q_9$ is used in place of the P channel MOS transistor $Q_2$ in the circuit shown in FIG. 3. The other portions are same as the circuit shown in FIG. 3, and same reference numericals are used as in FIG. 3. In the circuit shown in FIG. 9, the output stage is also formed by bipolar transistors, so that the driveability is increased and a high speed operation can be carried out.

Figure 10:
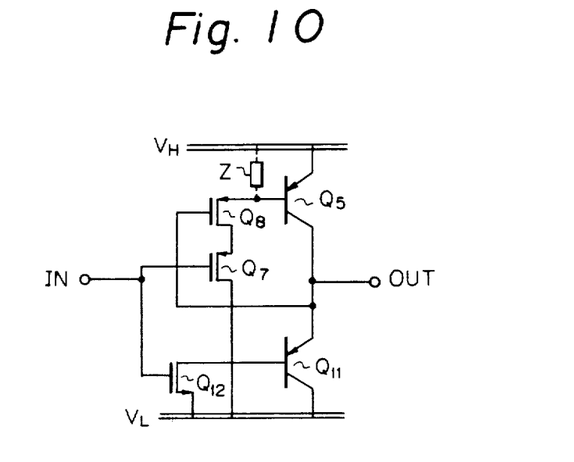

FIG. 10 shows a logical gate circuit as a still further embodiment of the present invention. In the circuit shown in FIG. 10, the N channel MOS transistor $Q_6$ in the circuit shown in FIG. 6 is replaced by a combination of an N channel MOS transistor $Q_{12}$ and a PNP transistor $Q_{11}$. The other portions of this circuit are the same as the circuit shown in FIG. 6. In this circuit, the output stage is also formed by the bipolar transistor, so that the driveability is increased and a high speed operation can be carried out.

As mentioned above, according to the present invention, a bipolar transistor having a large driving ability can be used and the power dissipation in the steady state can be reduced to zero, so that a logical gate circuit having low power dissipation and high speed operation can be realized. Further, in the present invention, a depletion-type MOS transistor $Q_4$ can be used, with an emitter-grounded bipolar transistor $Q_1$ in an amplifier or inverter so that the low level of the output OUT can be sufficiently lowered.

We claim:

1. A logical gate circuit comprising:

first and second power sources for supplying first and second levels, respectively;

an input terminal for receiving an input signal having one of the first and second levels;

an output terminal for providing an output signal having one of the first and second levels;

a switching transistor, having an emitter operatively connected to said second power source, having a collector operatively connected to said output terminal and having a base, said output terminal outputting the output signal with the second level in response to said switching transistor having an ON state;

an active load circuit, operatively connected between said first power source and the collector of said switching transistor and to said input terminal, said active load circuit being turned OFF in response to the input signal having the first level and being turned ON in response to the input signal having the second level, the output signal having the first level when said active load circuit is ON;

control transistor means, operatively connected to the base of said switching transistor having a control terminal connected (and) to said output terminal, for controlling said switching transistor in response to the output signal, said control transistor means turning ON and OFF in response to the output signal having the first level and the second level, respectively; and input transistor means, operatively connected between said first power source and said control transistor means and operatively connected to said input terminal, for controlling said switching transistor in response to the input signal, said input transistor means turning ON and OFF in response to the input signal having the first level and the second level, respectively, said switching transistor being turned ON only when said control and input transistor means are ON and provide a base current thereto.

2. A logical gate circuit, comprising:

a first power source for supplying a first level;

a second power source for supplying a second level lower than the first level;

an input terminal for receiving an input signal having one of the first and second levels;

an output terminal for providing an output signal having one of the first and second levels;

an NPN type bipolar transistor, having an emitter operatively connected to said second power source, having a collector operatively connected to said output terminal and having a base, said output terminal outputting the output signal with the second level in response to said NPN type bipolar transistor having an ON state;

a P-channel MIS transistor having a source operatively connected to said first power source, a drain operatively connected to said output terminal and a gate operatively connected to said input terminal, said P-channel MIS transistor being turned OFF in response to the input signal having the first level and being turned ON in response to the input signal having the second level, the output signal having the first level when said P-channel MIS transistor is ON;

a first N-channel MIS transistor having a source operatively connected to the base of said switching transistor and a gate operatively connected to said output terminal, for controlling said NPN type bipolar transistor in response to the output signal, said first N-channel MIS transistor turning ON and OFF in response to the output signal having the first level and the second level, respectively; and a second N-channel MIS transistor having a source connected to the drain of said first N-channel MIS transistor, a gate operatively connected to said input terminal and a drain operatively connected to said first power source, for controlling said NPN type bipolar transistor in response to the input signal, said second N-channel MIS transistor turning ON and OFF in response to the input signal having the first level and the second level, respectively, said NPN type bipolar transistor being turned ON only when said first and second N-channel MIS transistors are ON and provide a base current thereto.

3. A logical gate circuit according to claim 2, further comprising an NPN transistor having a collector operatively connected to said first power source, a base operatively connected to the drain of said P-channel MIS transistor and an emitter operatively connected to said output terminal.

4. A logical gate circuit according to claim 2 or claim 3, wherein said output terminal is connected to an input terminal of a next stage gate, and the input terminal of the next stage gate provides a high input impedance.

5. A logical gate circuit, comprising:
a first power source for supplying a first level;
a second power source for supplying a second level lower than the first level;
an input terminal for receiving an input signal having one of the first and second levels;
an output terminal for providing an output signal having one of the first and second levels;
a PNP type bipolar transistor, having an emitter operatively connected to said first power source, having a collector operatively connected to said output terminal, and having a base, said output terminal outputting the output signal with the first level in response to said switching transistor having an ON state;
an N-channel MIS transistor having a source operatively connected to said second power source, a drain operatively connected to said output terminal and a gate operatively connected to said input terminal, said N-channel MIS transistor being turned OFF in response to the input signal having the second level and being turned ON in response to the input signal having the first level, the output signal having the second level when said N-channel MIS transistor is ON;
a first P-channel MIS transistor having a source operatively connected to the base of said PNP type bipolar transistor and a gate operatively connected to said output terminal, for controlling said PNP type bipolar transistor in response to the output signal, said second P-channel MIS transistor turning ON and OFF in response to the output signal having the second level and the first level, respectively; and
a second P-channel MIS transistor having a source connected to the drain of said first P-channel MIS transistor, a gate operatively connected to said input terminal and a drain operatively connected to said second power source, for controlling said PNP: type bipolar transistor in response to the input signal, said second P-channel MIS transistor turning ON and OFF in response to the input signal having the second level and the first level, respectively, said PNP type bipolar transistor being turned ON only when said first and second P-channel MIS transistors are ON and provide a base current thereto.

6. A logical gate circuit according to claim 5, wherein said active load circuit further comprises a PNP transistor having a collector operatively connected to said second power source, a base operatively connected to the drain of said N-channel MIS transistor and an emitter operatively connected to said output terminal.

7. A logical gate circuit according to claim 5 or claim 6, wherein said output terminal is connected to an input terminal of a next stage gate, and the input terminal of the next stage gate provides a high input impedance.

8. A logical gate circuit, operatively connected to first and second power sources, to supply an output signal at an output terminal in response to an input signal at an input terminal, the first power source having a level lower than the second power source, said logical gate circuit comprising:
an NPN transistor and a PNP transistor, each having a collector connected to the output terminal, each having an emitter connected to the first and second power sources, respectively, and each having a base;
first and second N-channel MIS transistor means connected in series between the base of said NPN transistor and the second power source; and
first and second P-channel MIS transistor means connected in series between the base of said PNP transistor and the first power source, said first N-channel MIS transistor means and said first P-channel MIS transistor means having gates commonly connected to the output terminals turning ON and OFF in response to the output signal and said second N-channel MIS transistor means and said second P-channel MIS transistor means having gates commonly connected to the input terminal turning ON and OFF in response to the input signal.

9. A logical gate circuit according to claim 1, wherein said active load circuit comprises a plurality of first enhancement-type transistors, connected in parallel between said first power source and said output terminal, and having gates operatively connected to the input terminal,
wherein said input transistor means comprises a plurality of second enhancement-type transistors connected in series between said first power source and said control transistor means, and having gates operatively connected to said input terminal, and
wherein the input signal has separate portions supplied by said input terminal to corresponding gates of said first and second enhancement-type transistors.

10. A logical gate circuit according to claim 1, wherein said active load circuit comprises a plurality of first enhancement-type transistors, connected in series between said first power source and said output terminal, having gates operatively connected to said input terminal,
wherein said input transistor means comprises a plurality of second enhancement-type transistors connected in parallel between said first power source and said control transistor means, having gates operatively connected to said input terminal, and
wherein the input signal has separate portions supplied by said input terminal to corresponding gates of said first and second enhancement-type transistors.

* * * * *

UNITED STATES PATENT AND TRADEMARK OFFICE
CERTIFICATE OF CORRECTION

PATENT NO. : 4,716,310

DATED : Dec. 29, 1987

INVENTOR(S) : Tanizawa et al.

It is certified that error appears in the above-identified patent and that said Letters Patent is hereby corrected as shown below:

Abstract [57], line 8, after "levels" delete --,--.

Col. 2, line 41, "signal I" should be --signal IN--.

Col. 4, line 25, "OUT=$\bar{A}$HD 1 $\bar{A}_2$...$\bar{A}$n" should be -- OUT=$\overline{A_1 A_2 \ldots \ldots A_n}$ --.

line 38, "OUT=$\bar{A}_1+\bar{A}_2+\ldots+\bar{A}N$" should be --OUT=$\overline{A_1+A_2+\ldots+AN}$--;

line 52, delete "transistor";

line 58, "OUT=$\bar{A}_1+\bar{A}_2+\ldots+\bar{A}N$" should be OUT=$\overline{A_1+A_2+\ldots+AN}$--.

Col. 5, line 19, "cut," should be --cuts--.

Col. 6, line 24 (claim 1), delete "(and)".

UNITED STATES PATENT AND TRADEMARK OFFICE
CERTIFICATE OF CORRECTION

PATENT NO. : 4,716,310

DATED : Dec. 29, 1987

INVENTOR(S) : Tanizawa et al.

It is certified that error appears in the above-identified patent and that said Letters Patent is hereby corrected as shown below:

Col. 7, line 65, after "PNP" delete " : ".

Col. 8, line 33, after "terminals" insert --,--;

line 37, after "terminal" insert --,--.

Signed and Sealed this

Fifth Day of July, 1988

Attest:

*Attesting Officer*

DONALD J. QUIGG

*Commissioner of Patents and Trademarks*